United States Patent
Mizrachi et al.

(10) Patent No.: US 9,632,867 B2
(45) Date of Patent: Apr. 25, 2017

(54) METHODS, CIRCUITS, DEVICES, SYSTEMS AND MACHINE EXECUTABLE CODE FOR READING FROM A NON-VOLATILE MEMORY ARRAY

(71) Applicant: Spansion LLC, Sunnyvale, CA (US)

(72) Inventors: Kfir Mizrachi, Petach-Tikva (IL); Ifat Nitzan Kalderon, Petach-Tikva (IL); Clifford Alan Zitlaw, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 105 days.

(21) Appl. No.: 14/562,789

(22) Filed: Dec. 8, 2014

(65) Prior Publication Data

US 2016/0162355 A1  Jun. 9, 2016

(51) Int. Cl.
| | |
|---|---|
| *G06F 11/07* | (2006.01) |
| *G06F 11/10* | (2006.01) |
| *G11C 29/52* | (2006.01) |
| *G11C 16/34* | (2006.01) |
| *G11C 29/04* | (2006.01) |

(52) U.S. Cl.
CPC ........ *G06F 11/1048* (2013.01); *G11C 16/349* (2013.01); *G11C 29/52* (2013.01); *G11C 2029/0411* (2013.01)

(58) Field of Classification Search
CPC ............................ G06F 11/0727; G06F 11/073
USPC ...................................................... 714/6.1, 48
See application file for complete search history.

(56) References Cited

U.S. PATENT DOCUMENTS

| | | | | |
|---|---|---|---|---|
| 7,139,204 | B1 * | 11/2006 | Behera | G11C 29/16 365/201 |
| 2004/0117723 | A1 * | 6/2004 | Foss | G06F 11/1044 714/805 |
| 2008/0244338 | A1 * | 10/2008 | Mokhlesi | G06F 11/1068 714/702 |
| 2008/0244368 | A1 * | 10/2008 | Chin | G06F 11/1072 714/800 |
| 2008/0288135 | A1 * | 11/2008 | Katrak | H04L 9/3297 701/31.4 |
| 2009/0094493 | A1 * | 4/2009 | Iida | G06F 11/1008 714/718 |
| 2009/0235113 | A1 * | 9/2009 | Shaeffer | G06F 11/1004 714/5.11 |
| 2010/0115385 | A1 * | 5/2010 | Batra | G06F 11/0727 714/799 |
| 2010/0246298 | A1 * | 9/2010 | Zhang | G11C 5/147 365/200 |

(Continued)

FOREIGN PATENT DOCUMENTS

JP         2012086631 A  *  5/2012
WO    WO 83/01320 A1       4/1983

*Primary Examiner* — Chae Ko
(74) *Attorney, Agent, or Firm* — Vladimir Sherman; Professional Patent Solutions (57) ABSTRACT

Disclosed is a method for reading from a non-volatile memory (NVM) device including: retrieving a set of data from an NVM array according to a read sequence for a requested set of logical memory locations received from a host device, detecting errors in the set of data, preparing an error indicator to be output to a host device substantially upon detection of the errors and outputting the error indication in response to a command being received from the host device.

21 Claims, 8 Drawing Sheets

(56) References Cited

U.S. PATENT DOCUMENTS

| | | | |
|---|---|---|---|
| 2011/0044101 A1* | 2/2011 | Chou | G11C 16/34 365/185.03 |
| 2012/0066567 A1* | 3/2012 | Moyer | G06F 11/1076 714/763 |
| 2013/0179751 A1* | 7/2013 | Linstadt | G06F 11/1048 714/763 |
| 2013/0212431 A1* | 8/2013 | Ong | G06F 15/167 714/15 |
| 2015/0067444 A1* | 3/2015 | Eguchi | G06F 11/1048 714/766 |
| 2015/0100848 A1* | 4/2015 | Kalamatianos | G06F 11/1008 714/764 |
| 2015/0179281 A1* | 6/2015 | Lu | G06F 11/073 714/718 |
| 2015/0364168 A1* | 12/2015 | Riley | G06F 12/0623 711/5 |

* cited by examiner

METHODS, CIRCUITS, DEVICES, SYSTEMS AND MACHINE EXECUTABLE CODE FOR READING FROM A NON-VOLATILE MEMORY ARRAY

FIELD OF THE INVENTION

The present invention relates generally to the field of non-volatile memory arrays. More specifically, the present invention relates to methods, circuits, systems and machine executable code for reading from a non-volatile memory array including error correction functionality.

BACKGROUND

Systems on chips (SoC) may include or be associated with integrated circuits and/or memories such as a non-volatile memory (NVM) array.

An NVM array may be composed of NVM cells, ancillary circuitry, controller and additional circuits. The ancillary circuitry may include for example: array controls, address decoding circuits and sense amplifiers (SA). SAs may be configured to determine a value/level of one or more targeted NVM cell.

Some memory array types may include NVM arrays, floating gate arrays, array of eCT cells, array of MirrorBit cells, charge trapping cells and more.

The NVM cells may be single bit or multi-level storage cells and the cells may be programmable to different states, for example in a single bit configuration the cell may be programmable to either an erased (ERS) or programmed (PRG) stage.

According to some embodiments, the NVM cells may be accessed through wordlines (WLs), bitlines (BLs), select lines (SLs), memory gate (MGs) or otherwise. For each operational mode (Programming of cells, Erasing of cells, Reading of cells etc.) the WLs, BLs, SLs and/or MGs may be activated accordingly. Which WL, which BL, which SL and which MGs as well as if to operate them at all and to what voltage to supply to them is dependent on the mode (read algorithm, program algorithm, read algorithm and so on) and the selected addresses, the specific technology being used and more. Note, that some arrays may not include SLs, MGs or WLs or otherwise.

Some transistor types which may be used in associated circuitry are Pmos, Nmos, low voltage (LV) Nmos, LV Pmos, high voltage (HV) Nmos and HV Pmos, Zmos, BJT and more. HV transistors/cells may be differentiated from LV transistors/cells by being designed/configured to enable operation in a higher range of voltages across their channel compared to LV cells (for example, between a drain node and a source node of the transistor) and/or across the gate (for example: between their gate and bulk or ground node) and may include a thick oxide region compared to LV devices.

Modern SoC (System on Chip) devices often integrate Flash memory to achieve higher performance and lower current consumption than systems that use an external discrete flash memory device. These integrated flash arrays may include internal error correction and/or detection functionality to improve data integrity in high reliability applications.

SUMMARY OF THE INVENTION

The present invention includes methods, circuits, devices and systems and machine executable code for reading from a non-volatile memory (NVM) array. According to some embodiments of the present invention, an NVM array control circuit may include: a data reading circuit block adapted to read a set of physical memory locations on the NVM array which may correspond to a set of logical memory locations requested by a host device and an error detection circuit block which may signal the host device of one or more detected read errors substantially upon detection and prior to completing a read sequence for the requested set of logical memory locations.

According to some embodiments, an NVM array control circuit may include one or more error-type sub-circuits to indicate a type of read error detected. The NVM array control circuit may include one or more error-count sub-circuits to indicate a number of read errors in the requested set. The NVM array control circuit may include one or more address sub-circuits to indicate one or more memory locations (or locations associated with an error) associated with a detected read error. The sub-circuits may be: a register, a counter, volatile memory and/or a state machine or otherwise. One or more memory locations may be: a logical memory location of the first error detected, a logical memory location of the last error detected and/or a logical memory location of the first 2-bit error detected, a predetermined distance from the logical memory location and more.

According to some embodiments, the NVM array control circuit may be configured to output detected error information through one or more dedicated pins and/or one or more multi-purpose pins.

According to some embodiments, detected error information may be output responsive to a received command from the host device. The data reading circuit block may be configured to stop reading a requested set of data based on an input received from the host device responsive to a detected error. In other configurations, According to some embodiments, detected error information may be output dependent on exiting of a read sequence and/or outputting dependent on aborting a read sequence or otherwise.

According to some embodiments, a method for reading from a non-volatile memory (NVM) device may include retrieving a set of data from an NVM array according to a read sequence for a requested set of logical memory locations received from a host device, detecting errors in the set of data, preparing an error indicator to be output to a host device substantially upon detection of the errors and outputting the error indication in response to a command being received from the host device.

According to some embodiments, the method may include indicating a type of read error detected, indicating a number of read errors in the requested set, indicating one or more memory locations associated with a detected read error, outputting the detected errors responsive to a received command from the host device, and/or stopping a read sequence based on an input received from the host device responsive to a detected error.

According to some embodiments, a host device may be associated with a primary apparatus and an NVM device. The host device may include: a data controller to: (a) provide a set of logical memory locations to the NVM device and request to read information stored in the set, (b) receive at least a segment of the read information and (c) if the NVM detects an error, receive a read error indication substantially upon detection by the NVM substantially prior to completing a read sequence for the requested set of logical memory locations; and primary apparatus control circuitry to control at least one electro-mechanical functionality of the primary apparatus dependent on a received read error indication.

According to some embodiments, primary apparatus may be a vehicle and the primary apparatus control circuitry may be further, configured to disable a functionality of the primary apparatus if a 2-bit error indication is received from the NVM device.

According to some embodiments, a data controller may be configured to respond to the read error indication with one or more control signals to trigger the NVM device to relay additional error information to the controller. The additional error information may be one or more types of information such as: number of errors, logical memory location associated with an error detection and/or error detection type.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a circuit, computer or computing system, or similar electronic computing device, that manipulate and/or transform data represented as physical, such as electronic, quantities within the computing system's transistors, registers and/or memories into other data similarly represented as physical quantities within the computing system's memories, transistors, registers or other such information storage, transmission or display devices.

Embodiments of the present invention may include apparatus for performing the operations herein. This apparatus may be specially constructed for the desired purposes, or it may comprise a general purpose computer selectively activated or reconfigured by instructions/functions stored in the computer. Such instructions/functions may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a circuit/computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The present invention includes methods, circuits, devices, systems and machine executable code for reading data from a non-volatile memory (NVM) array. According to some embodiments, a memory device may include an NVM array and NVM array control circuits. NVM array control circuits may include error correction coding functionality for a data set being written to the array and error detection functionality for a data set being read from the array. Circuit segments of the control circuits associated with error checking data being read from the array may be adapted to generate an error indicator when an error is detected in a subset of the set of data prior to completion of reading the entire data set. According to some embodiments, additional Error Correction Code (ECC) supporting circuits may include: storage (register or otherwise) for type of read errors, counter and storage for number of read errors, storage of error address and more. According to some embodiments, the memory device may include one or more dedicated pins for relaying the stored information of the ECC supporting circuits and the error indicator and more. Optionally, these pins may also be used for additional purposes such as relaying data stored in the NVM array and/or additional control signals and more.

According to some embodiments, the NVM array may operate in conjunction with a host device, which host device may be configured to request a read operation from the NVM array. The host device may further be configured to stop reading the requested set of data from the NVM array, depending on the error indicator received and more. According to some embodiments, the error indicator may be relayed to the associated host device and may include information such as: the type of read error that was detected (1 bit error, 2 bit error and more), number of read error in requested set, memory location/address associated with detected error (user address, address of first error, address of last error, address of 2 bit error or otherwise). The output of information by the memory device may, optionally, be responsive to a received command from the host device, for example, responsive to an error indicator a host device may request from the memory device additional information such as the type of error detected.

Figure 1:
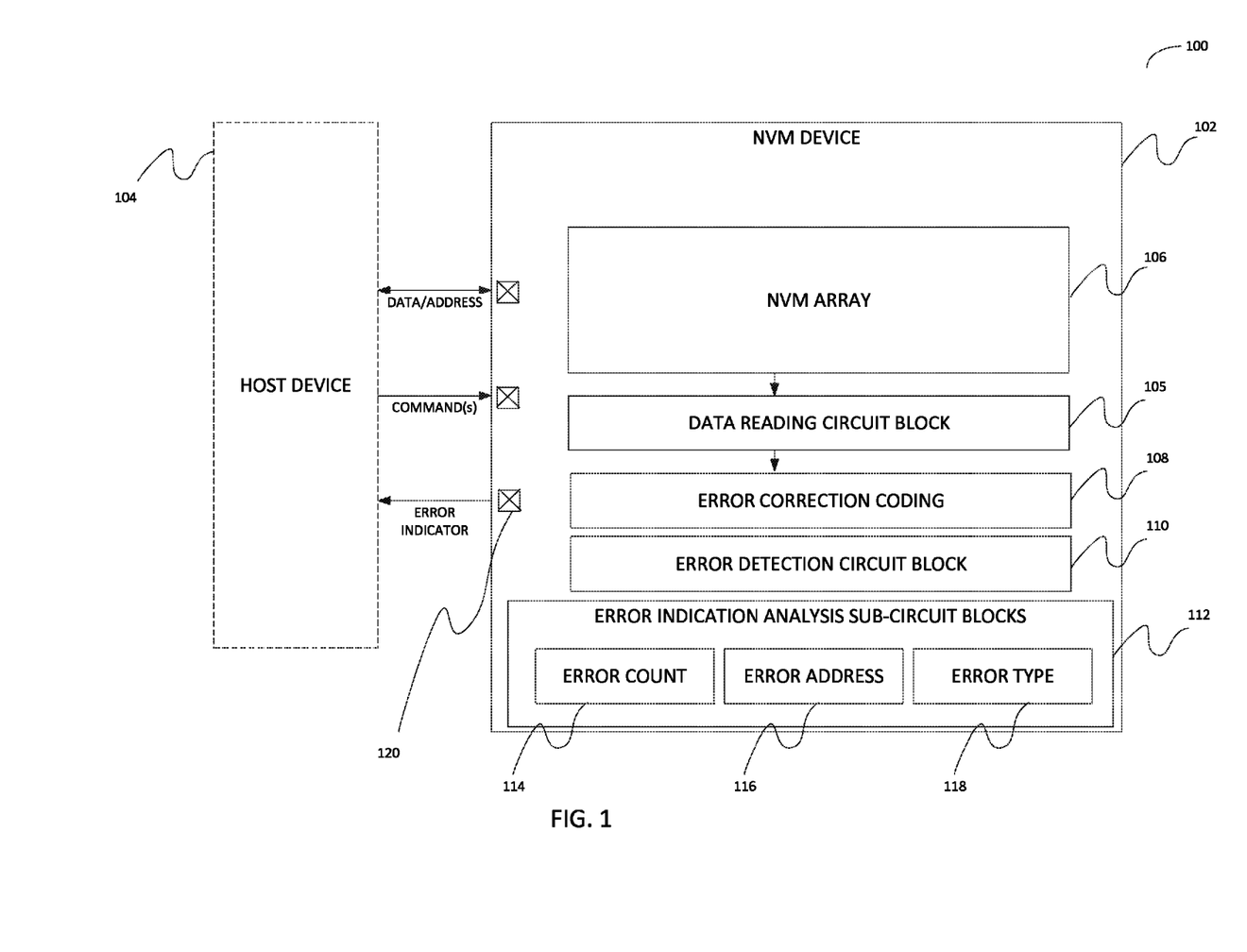
FIG. 1 shows a block level diagram of an NVM device in accordance with some embodiments of the present invention.

Turning to FIG. 1, depicted a block level diagram (100) of an NVM device (102) which may operate in conjunction with a host device (104). NVM device 102 may include an NVM array such as array (106). Array 106 may include memory cells such mirrorbit cells, floating gate cells, eCT cells, charge trapping cells or otherwise. Array 106 may be configured to store information electronically.

According to some embodiments, NVM device 102 may include NVM array control circuits such as data reading circuit block (105), ECC block (108), error detection circuit block (110) and error indication analysis sub-circuit blocks (112). Data reading circuit block 105 may be configured to receive from a host user address or logical memory location (for example via data/address input depicted) and decode/translate/decipher the logical memory location to a physical memory location. Data reading circuit block 105 may utilize the physical memory location to retrieve stored data from array 106. Data reading circuit block may include additional elements/lines and control circuits such as word lines (WL), bit lines (BL), select lines (SL), Ymux, Xdec, Sense Amplifiers (SA) and more.

According to some embodiments, ECC block 108 may include an error correction coding segment to encode/add information regarding the data being programmed to array 106 during a program function. ECC block 108 may operate on a program set.

According to some embodiments, error detection circuit (EDC) block 110 may operate on a subset of a read set which may be equal to, or different than a program set size. EDC block 110 may receive data from array 106 via data reading circuit block 105 and analyze the received data to detect errors. Optionally, EDC block 110 may be configured to correct at least some of the detected errors. EDC block 110 may also be configured to output an error indicator if an error is detected within a read set. Outputting of the error indication may be dependent on an interrupt pin which may be included in the command pins (depicted). For example, the error indication may be output synchronously or asynchronously, in response to toggling of a read clock received from host device 104 (part of commands depicted) or relayed once the error is detected and more. Optionally, EDC block 110 may relay error associated information to error indication analysis sub-circuit blocks 112. Error indication analysis sub-circuit block 112 may be embedded/included in EDC block 110 or may be one or more separate circuits. Error count (114) sub circuit(s) may count/analyze and/or store/save/record the number of errors. Optionally, error count 114 may store separately the number of error counts per predetermined section such as a sub-read section, store locally number of error of each type and/or number of errors within a predetermined period of time and more. Error count 114 may be restarted per read set or may be restarted based on a control received from host device 104 or otherwise.

According to some embodiments, error indication analysis sub-circuits block 112 may include error address (116) sub circuit(s). Error address 116 may store/save/record and/or analyze address associated information such as: logical memory address, physical memory address, location of first error detected, location of last error detected, or error type dependent storage so that, for example, if a two-bit error is detected then that location may be stored. Optionally, one or more different recorded address associated information may be stored and accessed separately (for example, both the physical memory address and the logical memory address or otherwise).

According to some embodiments, error indication analysis sub-circuits blocks 112 may include error type (118) sub circuit(s) which may be configured to analyze and/or store types of error encountered in one or more read sets. Some types of errors may include 1 bit errors, 2 bit errors, multiple bit errors and more. Error type 118 may also analyze and/or store the type of data in which the error was detected (for example, data or parity or otherwise). Error type 118 may also store/detect if error detection circuit block is disabled.

According to some embodiments, error type 118, error address 116 and/or error count 114 may include one or more counters, registers and/or non-volatile memory segments/circuits and/or a state machine(s).

According to some embodiments, nvm device 102 may include pins as depicted in pins (120). It is understood that any of a plurality of pins may be selected and that some pins may be a single input/output port while others may indicate a plurality of input/output ports or a bus. Pins 120 may be dedicated and/or multi-purpose pins for input and/or output signals and/or supply voltages and/or a combination of these functionalities and more.

According to some embodiments, some signals relayed via pins 120 may include: error indicator from device to host, address to NVM device from host, data from NVM device to host, and/or commands from host which may optionally be associated/dependent on error indicator and more.

Figure 2:
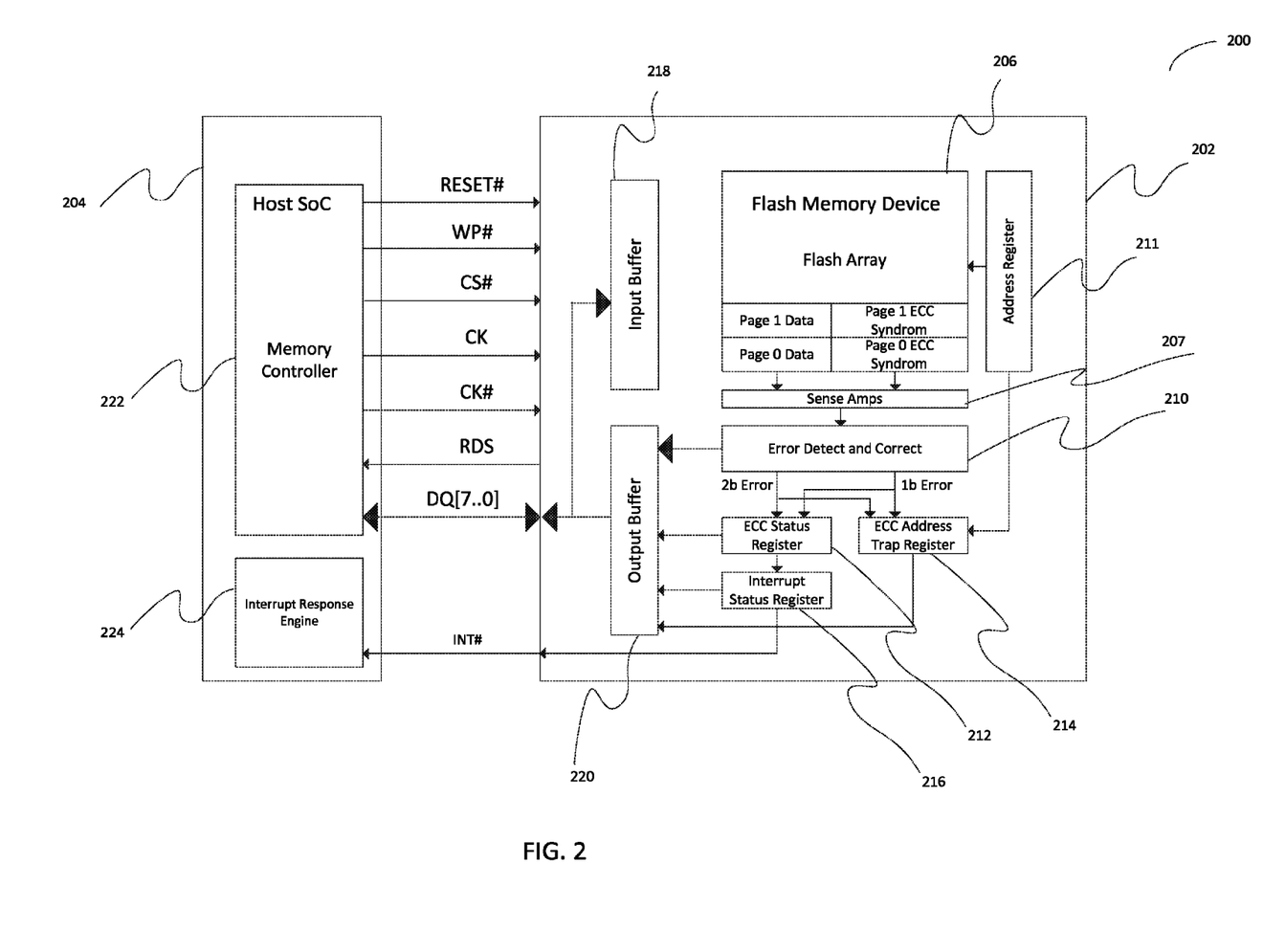
FIG. 2 shows a system including a flash memory device and a host device in accordance with some embodiments of the present invention.

Turning to FIG. 2, depicted is an example embodiment of a system (200) including a flash memory device (202) and a Host (System on Chip) SoC such as host (204). System 200 may be an example of the embodiments described with regard to FIG. 1.

According to some embodiments, additional information regarding the stored data may be saved in the array during program to be used during error detection and correction in a read function. Accordingly, flash array (206) may include data (as shown in Page 0 data block for example) and parity information (as depicted for example in Page 0 ECC syndrome block).

According to some embodiments, sense amplifier (SA) block (207) may be utilized to detect/decode read values received from array 206. Array 206 may receive location information from host 204 and relay decoded information via address register (211) to peripheral internal blocks of array 206 to cause the requested read set to be read by SA block 207.

According to some embodiments, Error Detect and Correct (EDC) block (210) may be substantially similar to EDC block 110. EDC 210 may receive read information from SA block 207 and may detect and, optionally, correct bits detected as errors. EDC 210 may also relay error correction information to sub-blocks for example, identify/signal when an error is detected, when an error is corrected, what type of error was detected etc. The sub blocks may include: ECC status register (212), ECC address trap register (214) and/or interrupt status register (216). ECC status register 212 may store the type of error. ECC address trap register 214 may store the location of an error based on ECC information received from EDC 210 and the location received from address register 211. Interrupt status register 216 may store the status of all features that can change the interrupt pin.

The user may read/access this register when the interrupt pin was changed to know which feature caused the change. It is further understood that ECC status register is substantially similar to error type 118 and/or error count 114 and that ECC address trap 214 is substantially similar to error address 116.

According to some embodiments, memory device 202 may include input buffer (218) and output buffer (220) for controlled input and output of data/signals/information.

According to some embodiments, host device 204 may include memory controller (222) to send read requests, logical data location and more. Memory controller may further control operation of memory device 202 via commands and inputs some examples of which are depicted, many additional/alternative inputs and different configurations may be understood. Some example signals and/or pins may include: Reset and/or Reset # to initialize operation; Write protect (WP or WP#) Chip Select (CS or CS#), Read clock (CK or CK#), RDS to indicate a read is requested and DQ[7:0] bus to relay requested read address and receive data and/or error information over. (# is used to indicate a barred signal or an inverted signal). An additional pin and/or signal is INT# which may indicate that an error was detected and/or that an error associated event has been recorded. INT# may also be used for additional signals such as end of power up of memory device 202, memory device 202 is ready or busy (depending on signal value) and more.

According to some embodiments, host 204 may include interrupt response engine (224) which may be included/embedded in memory controller 222 or separate from memory controller 222. Interrupt response engine 224 may analyze and/or respond to error information (such as error detection, error correction, type of error, number of errors, error location and more). Optionally, interrupt response engine 224 may cause a read operation to be aborted or stopped. Optionally, an interrupt response engine may be configured to receive interrupt signal(s) at least one of which may include an error indication. At least partially based on the received interrupt signal, host 204 may selectively request additional information in order to compute one or more following responses/actions.

According to some embodiments, host 204 may receive error information from memory device 202. The error information may be received in a synchronous or asynchronous manner. Some synchronous examples may include: host 204 checking if an error indication was recorded/received at the end of each read chunk, at the end of each read set or otherwise. Some asynchronous examples may include host 204 receiving an error indication via INT# at substantially anytime during the read function. In response to an asynchronous interrupt, host 204 may either automatically cause the read operation to stop in order to process the received error information or, may analyze the error information in parallel in order to decide if an abort read instruction should be sent.

According to some embodiments, although ECC sub circuits are depicted as being included in memory device 202, at least some of the sub circuits may also/alternatively be included in host 204. For example, interrupt status register 216, ECC status register 212 and/or ECC address trap 214 may be included in host 204 and may require additional pins/signals being received from memory device 202 and/or analysis to obtain information. For example: Host 204 may calculate the relative location of an error and store the appropriate address calculated based on CLK and initial address in a local ECC address trap register on host 204 based on timing of an asynchronous interrupt indicating an error received from memory device 202 to host 204. In another example, host 204 may store the number of errors in a read chunk by summing error indication received asynchronously per read set. More examples are understood.

Figure 3:
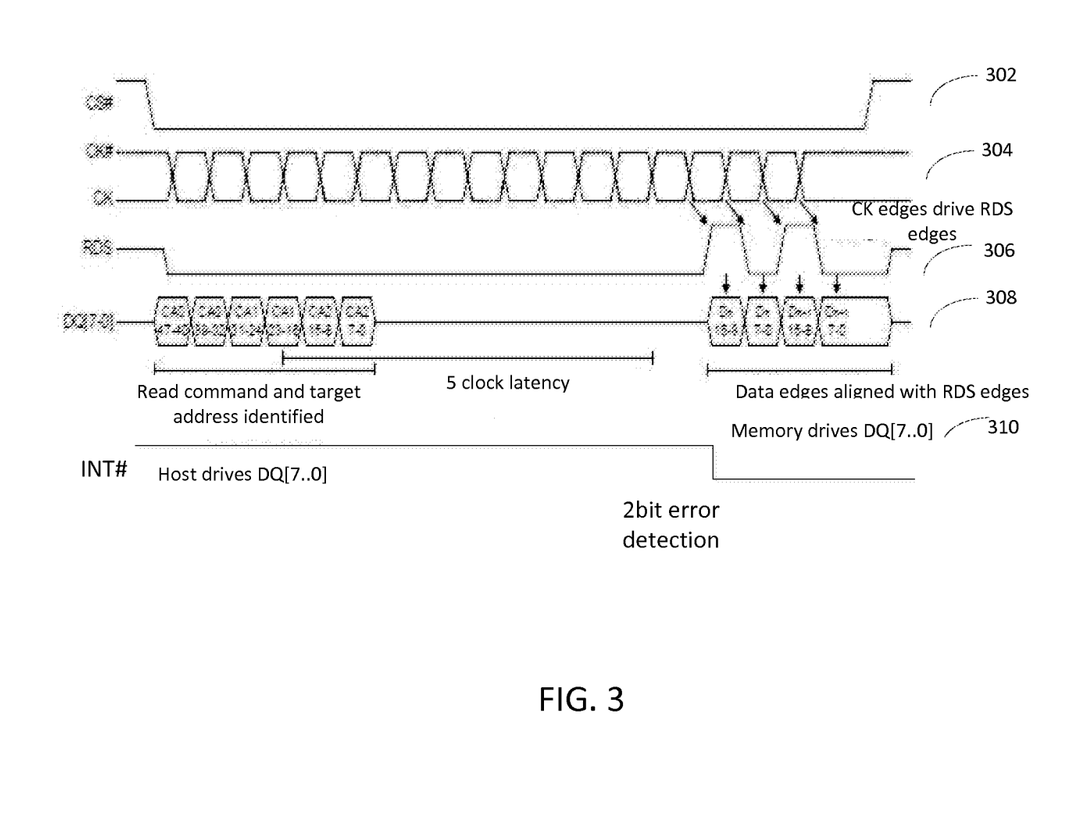
FIG. 3 shows example signals associated with the system of FIG. 2 in accordance with some embodiments of the present invention.

Turning to FIG. 3, shown are example signals associated with system 200, the figure is discussed by way of example, however system 200 is in no way limited by this example. CS# signal (302) may enable (at low) operation/access of memory device 202. CK# and CK (304) depict the read clock provided by host 204 to device 206. The Read Data Strobe (RDS) (306) may be an output from device 202 and may indicate data being transferred from device 202 to host 204. RDS may be correlated/associated with the rising and/or falling edges of CK during the data transfer over DQ[7 . . . 0] portion of read operations. DQ[7 . . . 0] (308), in this example may transfer commands and read address information to the device and subsequently data may be relayed from the device via the same pins. While the data is being output to host device the interrupt pin may also be utilized to output error information indicating for example that a 2 bit error was detected during the read function (310).

Figure 4:
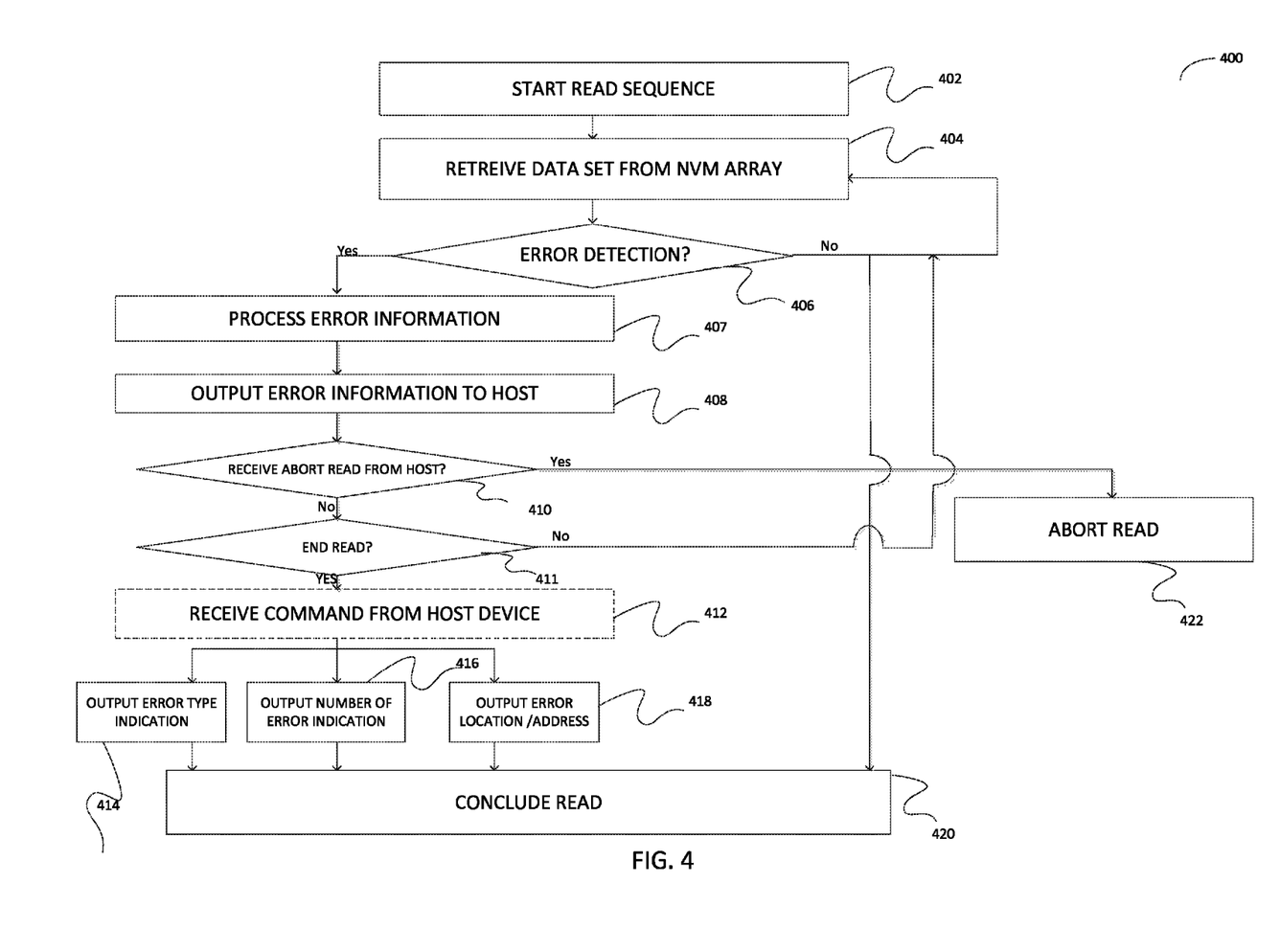
FIG. 4 is a flow chart of an example read sequence for a memory device in accordance with some embodiments of the present invention.

Turning to FIG. 4, shown is a flow chart (400) of an example read sequence of a memory device. A read sequence may be received (step 402) for example from a host device including location of requested information. The NVM device may retrieve information from the internal array (step 404). If an error is detected (step 406) then the NVM device may process and/or store associate error information (step 407) and output an error indication to the host (Step 408). Output of the information may be carried out either asynchronously or synchronously in response to a request from the host (for example at the end of a read set). The error may be received prior to completing a read sequence, some examples may include: upon detecting the error, upon concluding a read set but before finishing of the read chunk, and/or prior to a host device concluding a read a request for error may be relayed. Optionally, in response to the error indication, the NVM device may receive an abort/end read instruction. In some embodiments the NVM device may poll or await an abort instruction to be received (synchronously or asynchronously) from the host device (step 410). If an abort instruction is not received, and the read is not concluded/ended (step 411) a subsequent read may follow, a read sequence may be continued (such as continuing to a following logical address or otherwise) (step 404). Optionally, a request for additional information or a different command may be received from the host device (step 412). If an abort instruction is received, the read may be aborted (step 422), additional data sets may not be processed/carried out until the host device sends a new read request. In response to a request from the host device or at a predetermined time the NVM device may output additional error information such as number of errors (step 416), error type (step 414) and/or error location (step 418). Finally, if no error is detected or if error analysis is concluded or a read sequence is ended without error detection the read may be concluded (step 420). Note that steps 412-418 may also be carried out following an abort read instruction being received from the host device to aid in processing the error and relaying relevant/requested information to the host device for processing the same.

Figure 5A:
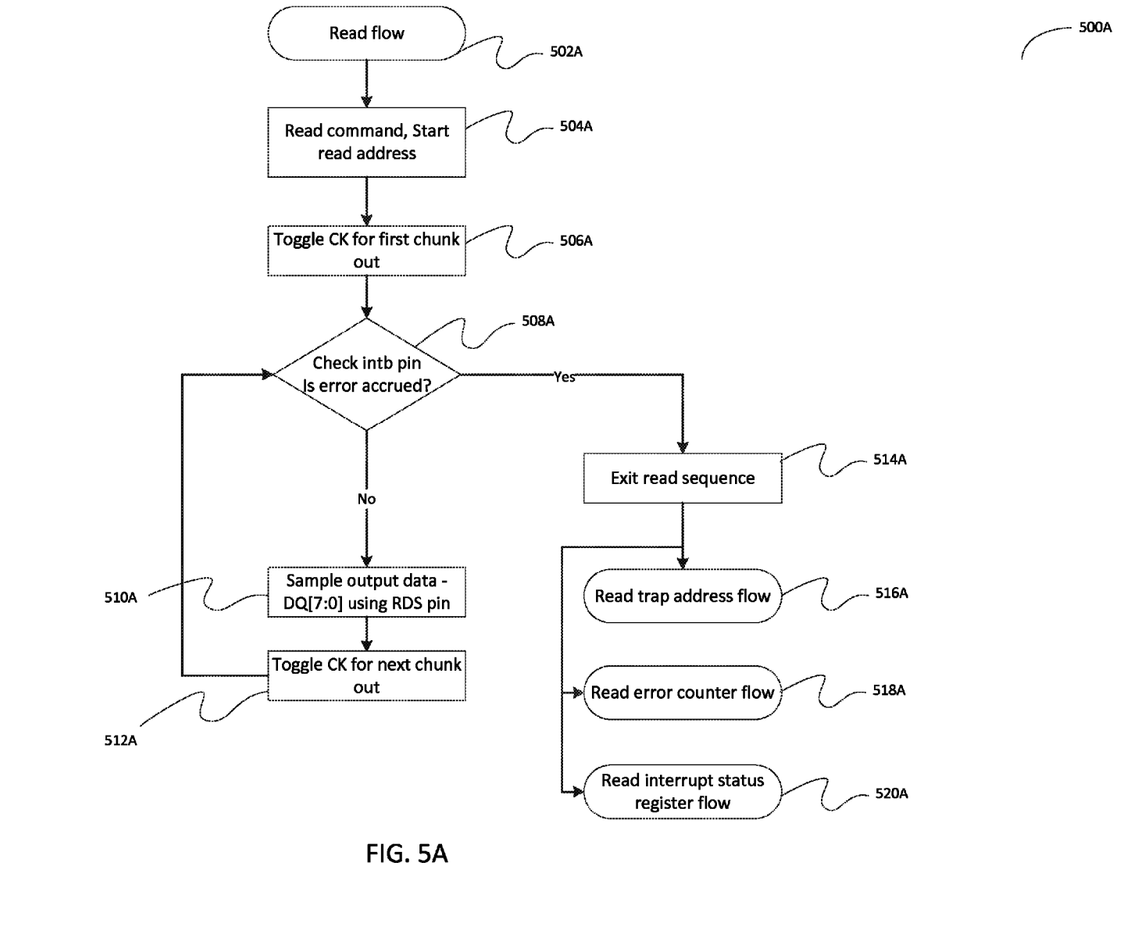
FIGS. 5A and 5B are flow charts of example read sequences for a host device in accordance with some embodiments of the present invention.

Turning to FIG. 5A, shown is a flow chart (500A) of a method for a host device to receive information from an associated NVM device including a synchronous error indication. A read flow may be initiated (step 502A) after which a read command may be produced/sent (step 504A). Accordingly, a read clock (CK) may be toggled to cause a first read chunk to be read (step 506A). At the end of a read chunk the interrupt pin may be sampled to check if an error was detected in the set (step 508A). If an error was not detected the sampled data may be output (step 510A) and a next chunk may be read (step 512A). If an error was detected at step 508A, the read sequence may be exited/aborted (step 514A) following which additional error information may be received such as error address (516A) error count (518A) and/or error status (step 520A) which may include information regarding the type of error and more.

Figure 5B:
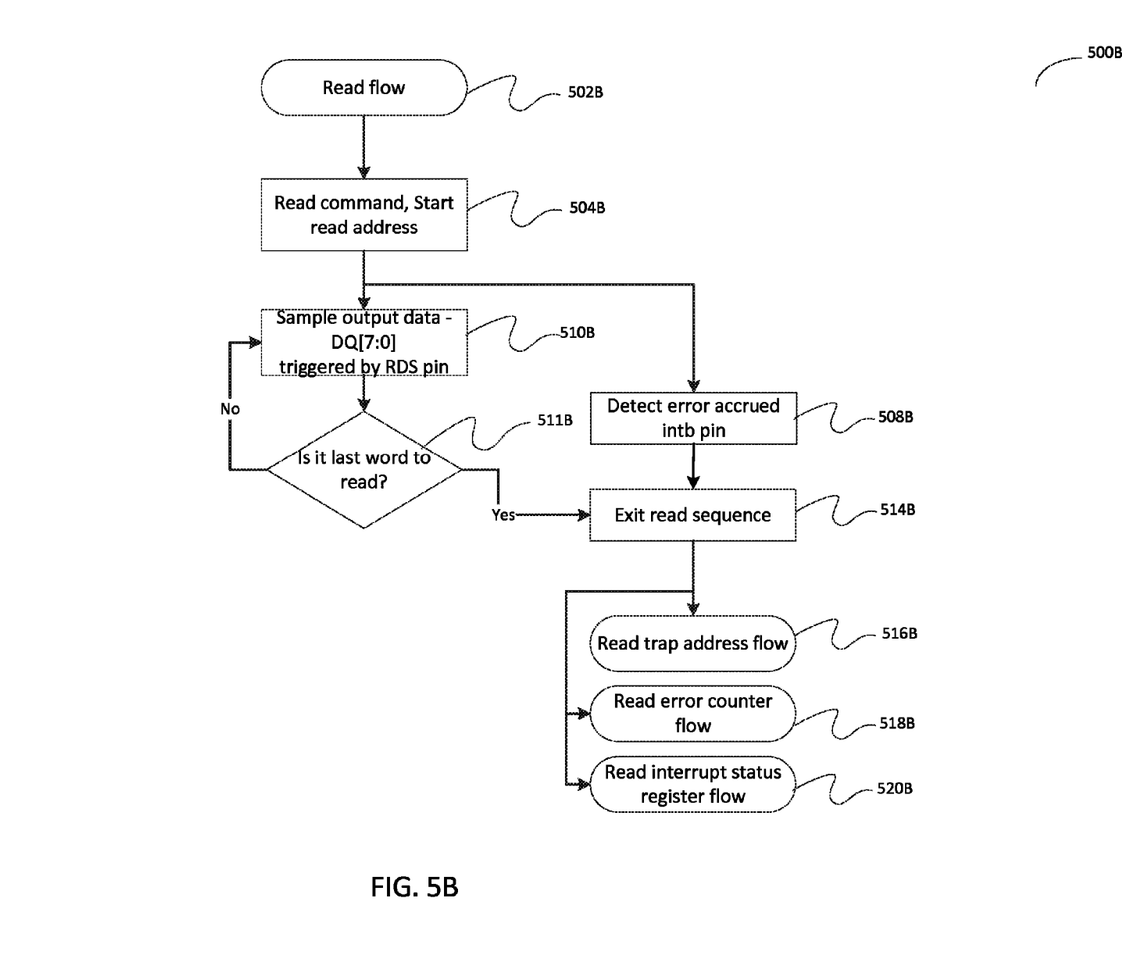

Turning to FIG. 5B, shown is a flow chart (500B) of a method for a host device to receive information from an associated NVM device including an asynchronous error indication. It is understood that steps 502B, 504B, 514B, 516B, 518B and 520B are substantially similar to appropriate steps of flow chart 500A (i.e. 502A, 504A etc.). In this asynchronous example, while an error is not received/detected (step 510B) the read process may be carried out (steps 511B-514B). If an error indication is received (step 508B) at any time during the read process the read sequence may be exited (step 514B) and the error analyzed (step 516B-520B). If en error is not detected at any stage the read is continued until the last read was detected (steps 511B and 514B). It is understood that steps 516B-520B may be carried out that the end of each read and/or may be case dependent for example: only if an error was accrued (step 508B), only if a request for additional error information is received or otherwise.

Figure 6A:
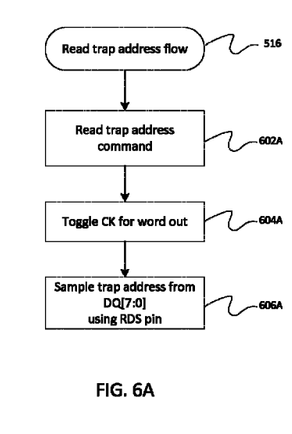
FIGS. 6A-6C are flow charts associated with steps of example read sequences associated with FIGS. 5A and 5B.
Figure 6B:
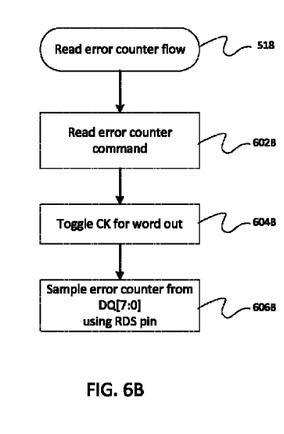
Figure 6C:
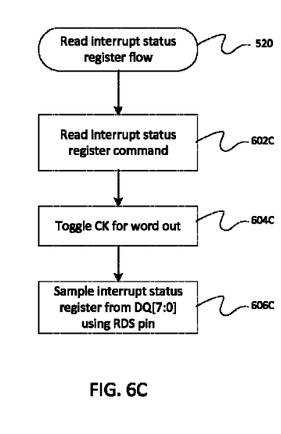

Turning to FIGS. 6A-6C depicted are flow charts associated with steps 516A-520A and/or 516B-520B. After an error is detected the host may request to receive error location information (step 516), request to receive an error count (step 518) and/or request to receive an error status (step 520). Following the request an appropriate command may be relayed to the NVM device (step 602A-602C) and the clock toggled for information to be released (step 604A-604C). The relevant data may then be sampled from the data bus (step 606A-606C).

Figure 7:
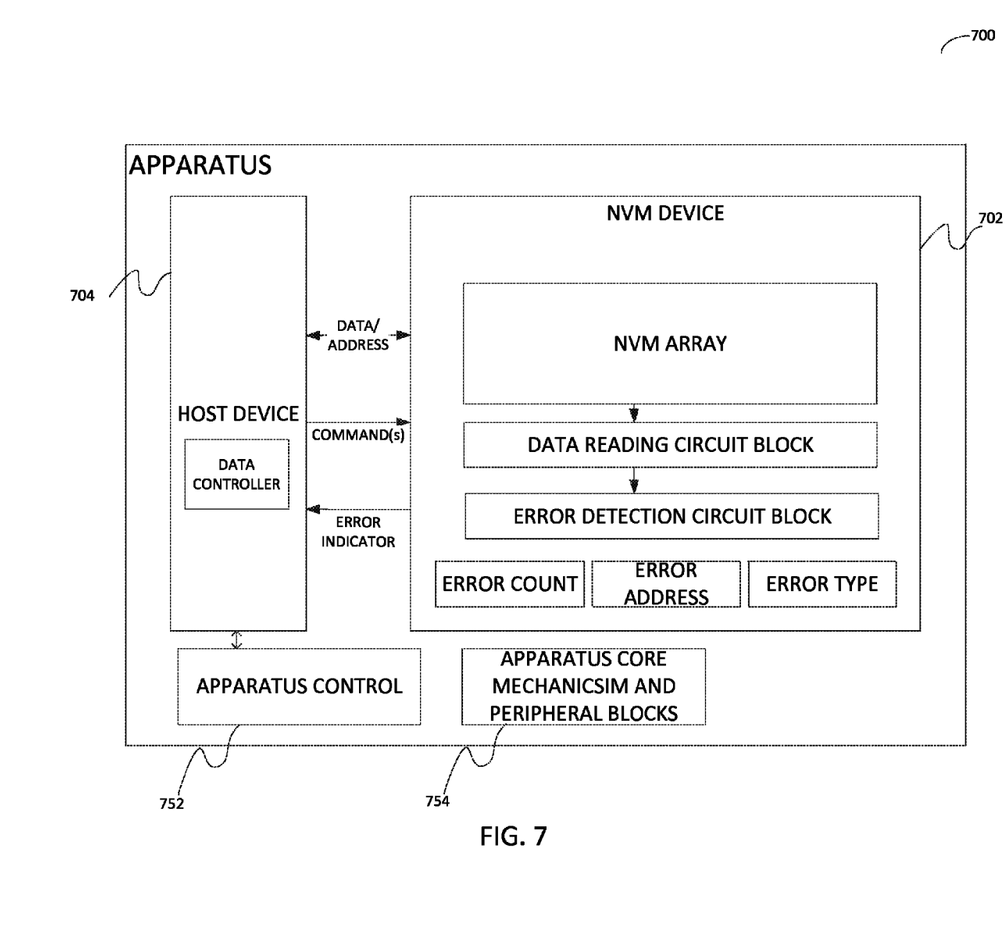
FIG. 7 is a block level diagram of a primary apparatus in accordance with some embodiments of the present invention.

Turning to FIG. 7, shown is a block level diagram of a primary apparatus (700). It is understood that NVM device (702) and host device (704) may be substantially similar to NVM device 102 and 202 and host devices 104 and 204 and discussion of those elements with regard to FIG. 1 and FIG. 2 is relevant here. Apparatus 700 may be a vehicle, medical device, electronic device or otherwise. Some example apparatus may include: a car, a smart phone, a computer and/or a heart and lung machine. Accordingly, apparatus core mechanism and peripheral blocks 754 may include operative, mechanical and electrical elements of those apparatus. For example, if apparatus 700 is a vehicle, apparatus core mechanism and peripheral blocks 754 may include: an engine, a computer, doors and more. In another example, if apparatus 700 is a smart phone, apparatus core mechanism and peripheral blocks 754 may include antennas, computing circuits, a screen and more. Apparatus 700 may include an apparatus control 752 which may be separate or embedded with the host device controller. Apparatus controller 752 may be configured to request data from NVM device 702 via host device 704 and control operation of apparatus core mechanism and peripheral blocks 754 at least partially based on the received information. For example, if apparatus 700 is a vehicle and host device relays to apparatus control 752 that a 2 bit error was detected then the vehicle may be disabled. In another example, if apparatus 700 is a medical device and a plurality of errors are detected exceeding an allowed threshold the medical device may be disabled or may initiate an alarm or otherwise.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A non-volatile memory (NVM) array control circuit comprising:
   a data reading circuit block adapted to read a set of physical memory locations on the NVM array which correspond to a set of logical memory locations requested by a host device;
   an error detection circuit block to relay to the host device an error indicator to signal one or more detected read errors substantially upon detection and prior to completing a read sequence for the requested set of logical memory locations; and
   wherein said data reading circuit block is further configured to stop reading a requested set of data based on an input received from the host device responsive to said error indicator.

2. The NVM array control circuit of claim 1, further comprising one or more error-type sub-circuits to indicate a type of read error detected and produce said error indicator.

3. The NVM array control circuit according to claim 2, wherein said sub-circuits are selected from the group consisting of: a register, a counter, volatile memory and a state machine.

4. The NVM array control circuit of claim 2, wherein said type of read error is selected from the group consisting of: a one bit error, a two bit error and a multiple bit error.

5. The NVM array control circuit of claim 1, further comprising one or more error-count sub-circuits to indicate a number of read errors in the requested set.

6. The NVM array of claim 5, wherein said sub-circuits are selected from the group consisting of: a register, a counter, volatile memory and a state machine.

7. The NVM array control circuit of claim 5, wherein said number of read errors is selected from: number of errors per sub-read section, number of errors of an error type; number of errors within a predetermined period of time and number of errors within a predetermined section.

8. The NVM array control circuit of claim 1, further comprising one or more address sub-circuits to indicate one or more memory locations associated with a detected read error.

9. The NVM array control circuit of claim 8, wherein said one or more memory locations are at least partially dependent on the memory locations selected from the group consisting of: a logical memory location of the first error detected, a logical memory location of the last error detected and a logical memory location of the first 2-bit error detected.

10. The NVM array control circuit of claim 1, further configured to output detected error information through one or more dedicated pins.

11. The NVM array control circuit of claim 10, wherein said detected error information is output responsive to a received command from the host device.

12. The NVM array control circuit of claim 1, further configured to output detected error information through one or more multi-purpose pins.

13. The NVM array control circuit of claim 12, wherein said detected error information is output responsive to a received command from the host device.

14. A method for reading from a non-volatile memory (NVM) device comprising:
- retrieving a set of data from an NVM array according to a read sequence for a requested set of logical memory locations received from a host device;
- detecting errors in said set of data;
- preparing an error indicator to be output to a host device;
- outputting said error indication in response to a command being received from the host device; and
- stopping a read sequence based on an input received from the host device responsive to a detected error.

15. The method according to claim 14, further comprising indicating a type of read error detected.

16. The method according to claim 14, further comprising indicating a number of read errors in the requested set.

17. The method according to claim 14, further comprising indicating one or more memory locations associated with a detected read error.

18. The method according to claim 14, wherein said outputting is selected from the group consisting of: outputting responsive to a received command from the host device; outputting dependent on exiting of a read sequence; outputting dependent on aborting a read sequence.

19. A host device associated with a primary apparatus and a non-volatile memory (NVM) device, the host device comprising:
- a data controller to: (a) provide a set of logical memory locations to the NVM device and request to read information stored in said set; (b) receive at least a segment of said read information; and (c) if said NVM detects an error, receive a read error indication substantially upon detection by the NVM substantially prior to completing a read sequence for the requested set of logical memory locations; and
- primary apparatus control circuitry to control at least one electro-mechanical functionality of the primary apparatus dependent on a received read error indication.

20. The host device according to claim 19, wherein said primary apparatus is a vehicle and said primary apparatus control circuitry is further, configured to disable a functionality of the primary apparatus if a 2-bit error indication is received from the NVM device.

21. The host device according to claim 19, wherein said data controller is further configured to respond to the read error indication with one or more control signals to trigger the NVM device to relay additional error information to said controller wherein said additional error information is one or more types of information selected from the group consisting of: number of errors, logical memory location associated with an error detection and error detection type.

* * * * *